(12) United States Patent
Dubey et al.

(10) Patent No.: US 10,069,511 B2
(45) Date of Patent: Sep. 4, 2018

(54) LOSSLESS DATA COMPRESSION

(71) Applicant: Texas Instruments Incorporated, Dallas, TX (US)

(72) Inventors: Aishwarya Dubey, Plano, TX (US); Hetul Sanghvi, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 15/376,170

(22) Filed: Dec. 12, 2016

(65) Prior Publication Data
US 2018/0167083 A1   Jun. 14, 2018

(51) Int. Cl.
*H03M 7/00* (2006.01)
*H03M 7/30* (2006.01)
*G06F 3/06* (2006.01)

(52) U.S. Cl.
CPC .......... *H03M 7/3059* (2013.01); *G06F 3/065* (2013.01); *G06F 3/0608* (2013.01); *G06F 3/0619* (2013.01); *G06F 3/0641* (2013.01); *G06F 2212/401* (2013.01)

(58) Field of Classification Search
CPC .. H03M 7/3059; G06F 3/0608; G06F 3/0619; G06F 3/065; G06F 3/0641
USPC .............................................. 341/50, 55, 87
See application file for complete search history.

(56) References Cited

U.S. PATENT DOCUMENTS

| | | | |
|---|---|---|---|
| 9,123,090 B2 | 9/2015 | Suzuki | |
| 9,748,972 B2 * | 8/2017 | Wheeler | ................. H03M 7/40 |
| 9,843,588 B2 * | 12/2017 | Evans | ................... H04L 63/101 |
| 9,900,025 B2 * | 2/2018 | Xu | ........................... H03M 7/30 |
| 9,923,577 B1 * | 3/2018 | Zhang | ................. H03M 7/6017 |
| 2012/0239612 A1 | 9/2012 | George et al. | |
| 2015/0256863 A1 | 9/2015 | Choi et al. | |
| 2016/0050431 A1 | 2/2016 | Gupte et al. | |

FOREIGN PATENT DOCUMENTS

JP           201213657 A      6/2012

OTHER PUBLICATIONS

International Search Report and Written Opinion, PCT/US2017/065915, dated Apr. 12, 2018 (6 pages).

* cited by examiner

*Primary Examiner* — Brian Young
(74) *Attorney, Agent, or Firm* — Gregory J. Albin; Charles A. Brill; Frank D. Cimino (57) ABSTRACT

A method of data compression includes obtaining binary sensor data having rows with multi-bit data samples. The rows are divided into data groups each including two or more samples. A precedent value is selected for the rows or respective precedent values are selected for each data group. A compressed row of compressed sensor data is generated from each row by calculating differences between the data sample and the precedent value for its associated data groups. A Compression Information Packet (CIP) is generated for each row including information for returning the binary sensor data that includes a compressed predicate indicating whether each data group is stored compressed, a data group size being a multi-bit value that stores a group size used for row compression, and a compressed word size that stores a dynamic range of the row compression. The compressed rows are stored as stored compressed data along with the CIPs.

19 Claims, 12 Drawing Sheets

| W/N BITS | 32 BITS | 64 BITS | 4 BIT | 8 BIT | ECC | |
|---|---|---|---|---|---|---|
| PREDICATE | COMPRESSED DATA SIZE | CUMULATIVE DATA SIZE | CW SIZE | DG SIZE | SIGNATURE | ROW 1 |
| PREDICATE | COMPRESSED DATA SIZE | CUMULATIVE DATA SIZE | CW SIZE | DG SIZE | SIGNATURE | ROW 2 |
| PREDICATE | COMPRESSED DATA SIZE | CUMULATIVE DATA SIZE | CW SIZE | DG SIZE | SIGNATURE | ROW 3 |
| PREDICATE | COMPRESSED DATA SIZE | CUMULATIVE DATA SIZE | CW SIZE | DG SIZE | SIGNATURE | ROW 4 |

W= RASTER ROW SIZE
N= DATA GROUP SIZE

LOSSLESS DATA COMPRESSION

FIELD

Disclosed embodiments generally relate to methods for losslessly compressing and storing digital data including the organization of pixel information in memory.

BACKGROUND

Techniques for compressing data are common in the fields of communications and computers. In communications, it is often desirable to transmit compressed strings of data that upon reception can be reconstructed into their original form. Transmitting compressed data takes less time than transmitting the same data in an uncompressed format. In computers, compressed data offers a storage advantage over non-compressed data. Thus, for a storage device having a fixed storage capacity, more files can be stored therein if they are compressed.

Data compression techniques can be divided into two major categories: lossy and lossless. Lossless data compression techniques are employed when it is required that no information is lost in the compression/decompression process. Lossy data techniques are less accurate than lossless techniques but are generally are much faster. By definition, lossless compression techniques employ methods that guarantee the precise duplication of data after it has passed through the compression/decompression cycle. Lossless compression is most commonly associated with storage of digital data used in with a computer. Such applications include the storage of data base records, spread sheet information, and word processing files. If information in a data message is redundant so that its omission does not reduce, in any way, the information encoded in the data, the message can be shortened without losing any of the information encoded therein. Thus, lossless data compression reduces the size of the message without compromising the integrity of the information conveyed by the message.

Advanced driver assistance system (ADAS) algorithms as well as gaming, virtual reality, machine learning algorithms are all becoming limited by double data rate (DDR) memory performance and bandwidth. The data streams (radar data, images data, etc.) typically do show strong locality, but the bits are only "roughly equal". Online data compression for raster data is needed to use DDR memory more effectively.

Compressing data is generally an easy problem to solve. The problems that are harder to solve are ensuring that the data size of the compressed data stream is bounded even for random data samples. Another problem is providing a decompression scheme during data read that is fast. Other problems include the requirement of being able to handle different data types and memory access schemes for such distinct data types. For example, a cache line fill versus a Direct Memory Access (DMA) controlled image data access will require different access schemes. Finally, another problem is providing random access to the compressed data within a deterministic and fixed time interval.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments provide methods and systems for dynamically configurable online lossless compression and decompression of rasterized sensor data, such as data from image sensors or radar sensors that provide random data access within a deterministic and fixed time. Disclosed embodiments include a method and system for lossless data compression with single clock cycle decompression.

The method comprises obtaining binary sensor data comprising a plurality of rows with each row including a plurality of multi-bit data samples. The rows are each divided into a plurality of data groups each including two or more samples. A precedent value is selected for each row or respective precedent values are selected for each of the data groups (DGs). A compressed row of compressed sensor data is generated from each row by calculating differences between each data sample and the precedent value for its associated DG. A Compression Information Packet (CIP) is generated for each row that includes information for losslessly returning (i.e. decompressing) the sensor data.

The CIP information includes a compressed predicate comprising a data structure which indicates whether each of the DGs is stored compressed, a flexible DG size being a multi-bit value that stores a group size used for row compression, and a compressed word size being a multi-bit value that stores a dynamic range of the row compression. The DG size can be for example, 16, 32 or 64 bits. The CIP information can also include a cumulative data size being a multi-bit value up to 128 bits which indicates the cumulative data size of the raster data till that row in the frame being stored, and a signature that captures the error correction code (ECC) and/or a cyclic redundancy check (CRC) encoded representation of the CIP for the row.

The compressed rows are stored as stored compressed data along with the CIPs. The method can further comprise decompressing the stored compressed data to losslessly recover the sensor data from any random memory location, and recovering all of the sensor data in a single clock cycle.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
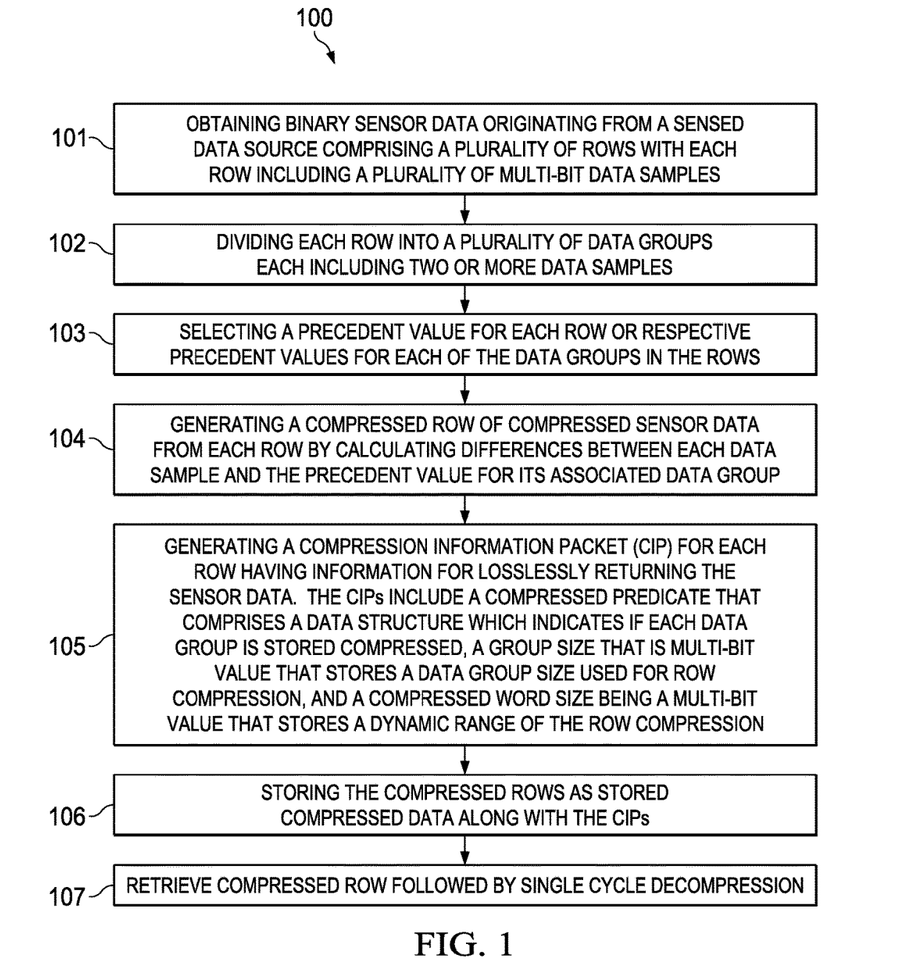
FIG. 1 is a flow chart showing steps for an example method of lossless data compression, according to an example embodiment.

FIG. 1 is a flow chart showing steps for an example method 100 of lossless data compression of sensed data streams, according to an example embodiment. The sensed data streams can comprise radar data for radar applications such as frequency-modulated continuous-wave (FMCW) radar, or pixel data for imaging, such as for Advanced Driver Assistance Systems (ADAS) applications.

Step 101 comprises obtaining binary sensor data originating from a sensed data source comprising a plurality of rows with each row including a plurality of multi-bit (e.g., 16) data samples. Each row corresponds to a frame or as a channel, where the frames may include 2D planar data corresponding to each image captured at the same or different exposure times (e.g., 3) in the case of imaging application, or 2D planar data corresponding to radar sensor chirp reflections for every radar dwell. The sensed data source can be a sensor that provides real-time data as a data stream, or the data source can be a memory that stores sensor data obtained from a sensor.

Step 102 comprises dividing each row into a plurality of DGs each including two or more data samples. A "data group" (DG) as used herein is a consecutive group of raster data values (e.g., samples or pixels) that demonstrate data locality and are thus are relatively easy to compress. There will be 2 or more DGs in each row of rasterized data. For example, in FIG. 2 described below there are for example 4 DGs each having 4 samples per row shown in the example compression shown in FIG. 2 described below.

Figure 2:
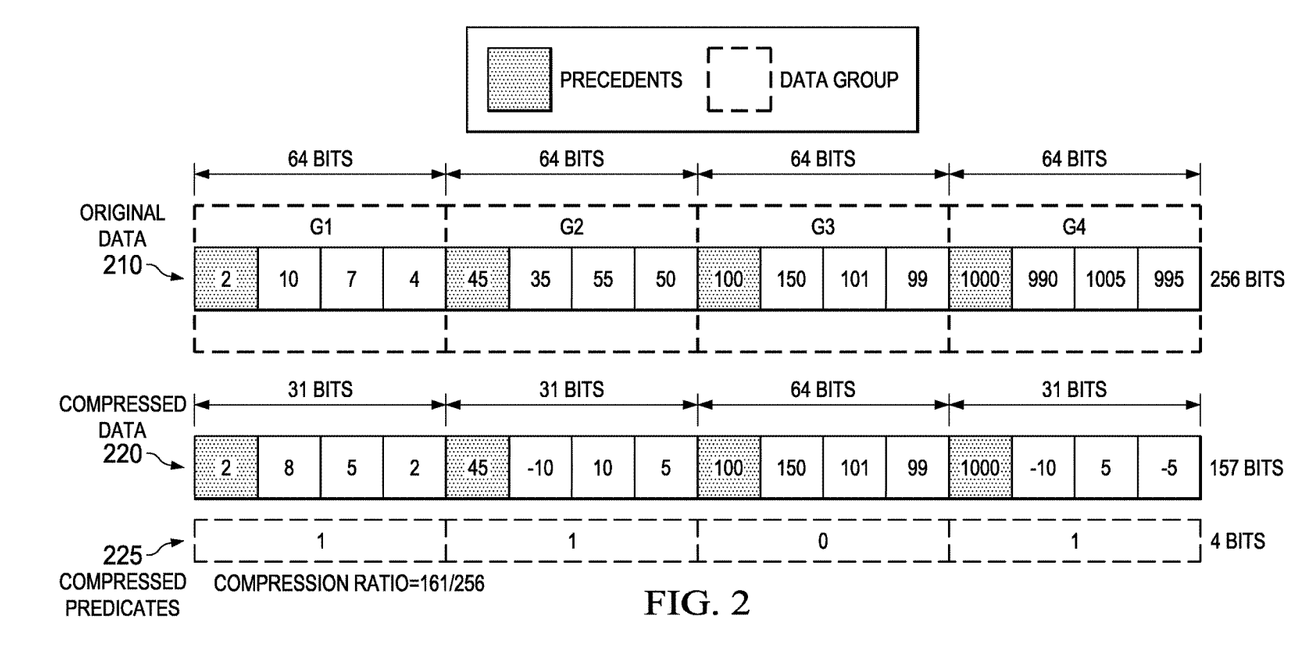
FIG. 2 shows an example of disclosed compression workings where a row comprising 256 bits of original data is converted in 157 bits of compressed data. Precedents for each DG in the row are shown for example as being the first data sample value in the DG.

Step 103 comprises selecting a precedent value for each row or respective precedent values for each of the DGs in the rows. A "precedent value" as used herein is a value selected to minimize what is termed herein as "drift". Drift is defined as the signed difference between current data value and the precedent within the DG being compressed. In one particular embodiment, as shown in FIG. 2, the precedent is the first data sample value in a DG.

There are a variety of methods for dynamically selecting precedent values. One way is such that it results into a smallest compressed data (highest compression ratio). Precedent values can also be selected based on a predicted value of every sample (e.g., pixel) in the DG, where the generating of a predicted value can be by linear, quadratic, mean, median or any other method which yields a better match for the sample being compressed. The precedent selection is an intelligent method generally performed with dedicated hardware. A precedent can be any data value in the row, average of all the data values, median of the data values or a user' configured value. The circuit for precedent selection can also include statistical histogram computation for the data being compressed (see statistical histogram computation block (HIST) 311 shown in FIG. 3B described below) and the precedent can be selected based on the output of this block and heuristic rules that are pre-computed offline.

Step 104 comprises generating a compressed row of compressed sensor data from each row by calculating differences between each data sample and the precedent value for its associated DG. Step 105 comprises generating a CIP for each row having information for losslessly returning the sensor data. As noted above, a CIP includes a compressed predicate that comprises a data structure which indicates if each DG is stored compressed, a group size that is multi-bit value that stores a flexible data group size used for row compression, and a compressed word size being a multi-bit value that stores a dynamic range of the row compression. (See the example CIPs shown in FIG. 4 described below). Step 106 comprises storing the compressed rows as stored compressed data along with the CIPs. For example, see the storage options described below relative to FIG. 6A and FIG. 6B.

Method 100 can further comprise decompressing the stored compressed data. Step 107 shown in FIG. 1 comprises retrieving the stored compressed data from a memory (e.g., DDR or on-chip RAM) and decompressing to recover the original uncompressed data using the CIPs within a single cycle. For example, for decompressing, see the decompression circuit options described in FIG. 5A, FIG. 5B and FIG. 5C.

Figure 3A:
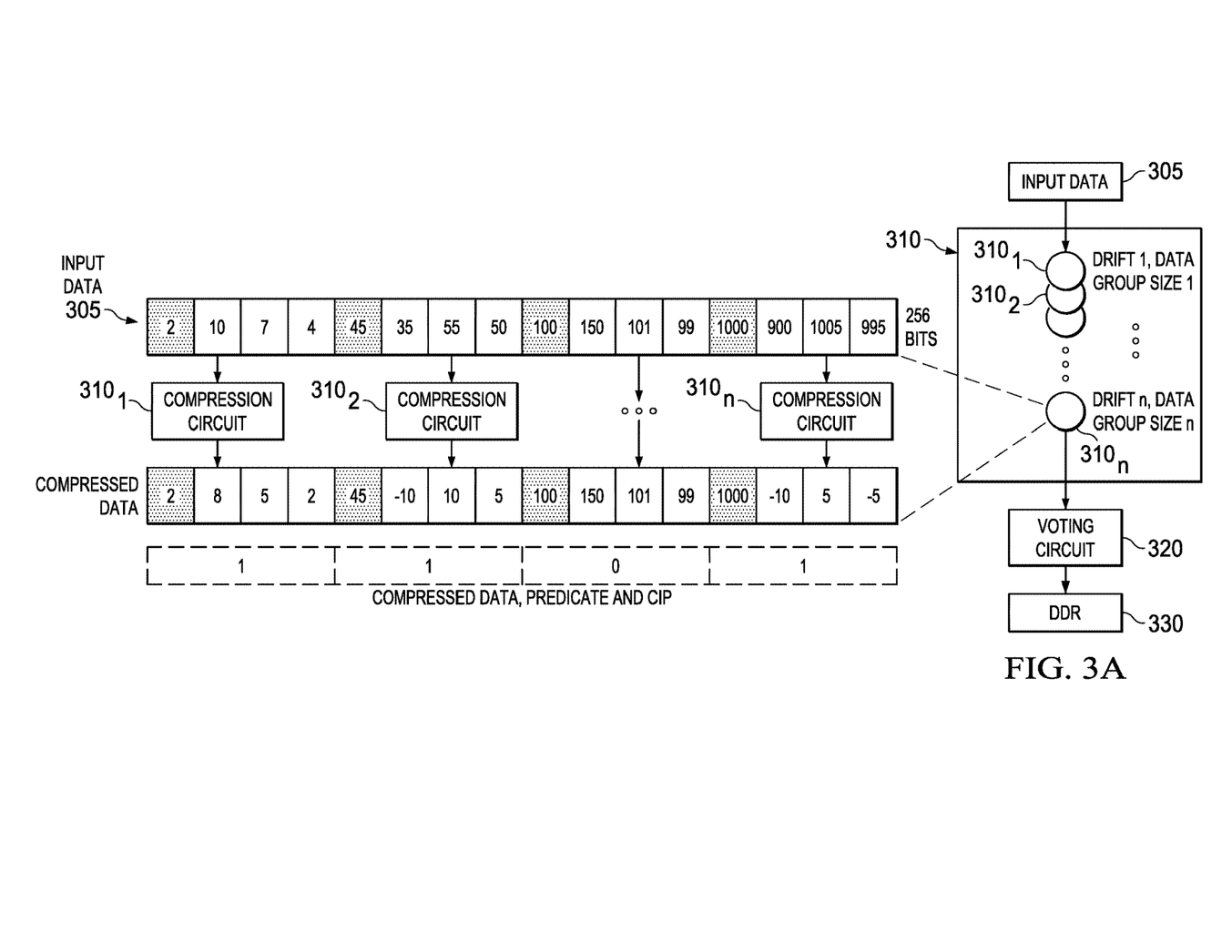
FIG. 3A shows example lossless data compression having a single clock cycle parallel compression block and a voting circuit for obtaining compression parameters for obtaining a minimum compression ratio and compressed data size.

The method can also include parallel single clock cycle processing of all the plurality of DGs. Hardware is provided for calculating compressed output for all DGs in the row simultaneously (not linearly), such as shown in FIG. 3A described below, so that the time required for compression is independent of the DG group configuration, and precedent selection etc. The method can also comprise dynamically selecting a compressed word size to obtain the best compression output, reflected in a low compression ratio.

Compression parameters can be dynamically selected through control by the configuration including a drift, compressed word size, precedent values, and the DG size. The method can further comprises decompressing stored compressed data to losslessly recover the original sensor data including accessing random locations in a fixed time. Accessing random locations in fixed time means accessing any data value (e.g., pixel value) in a constant time. This is non-trivial as every DG that comes before that data value can be compressed onto any size. Instead of having to sequentially adding up the size of all the previous DGs, the CIP is defined. Using the cumulating data size, predicate, compressed word size and DG size, one can determine where the data value lies in the memory. The decompressing can comprise a single cycle for recovery of the sensor data. The method can further comprise using parallel map-reduce functions and a single cycle address pointer calculation for the decompressing.

FIG. 2 shows an example of a disclosed compression operation where a row comprising 256 bits of original data 210 that is uncompressed is converted into compressed data 220 comprising a row comprising 157 bits along with compressed predicates 225 shown comprising 4 1 bit compressed predicates. The compressed predicates shown are one bit data structures that indicates if a DG in the compressed data 220 has been compressed or not.

This example row compression provides a compression ratio of 161/256=59%. Precedents for each of the 4 data groups is shown as the being the first data sample value in the DG, with each sample having 16 bits, so that the DGs each have 64 bits. In the first row the DGs are shown as $G_1$, $G_2$, $G_3$ and $G_4$. In the compression scheme shown each DG has 4 samples, every data sample is 16 bits in the original data 210, and the compressed word size used was 5 bits. The compressed word size as used herein is a dynamically selectable compression parameter typically from 4 to 10 for 16 bit data which defines the dynamic range of drift for the data that can be compressed inside a DG.

In this example, $G_1$, $G_2$, and $G_4$ are seen to be compressed, while there is no compression for the $G_3$ because the range of drift for data in $G_3$ is 50 (difference between 100 and 150 that are the minimum and maximum data values in the DG respectively) which is greater than the number that can be encoded in the 5 bits set by the compressed word size used. In $G_1$, using the precedent of 2, the non-precedent original samples are processed by subtracting 2 from the original data sample values to provide the compressed data value. For the second sample of the second data group the calculation is 10−2=8. The compressed data predicate shown is given a 1 in case of $G_1$, $G_2$, and $G_4$ which received compression, and a 0 for $G_3$ which received no compression. An advantage is provided by disclosed methods by using a compressed predicate value of zero (or 1) to avoid decompression processing a DG when no data compression is implemented for the DG.

A basic principle for disclosed compression is to never increase the compressed data size in any row defined as the size of the compressed row plus the size of the CIP beyond a predetermined size determined by the original data size plus W/N bits, where W is original data length (in bits) and N is the size (in bits) of the DG. For example the original data length (row) is 256 bits in FIG. 2 and the final data length is 157 bits.

FIG. 3A shows example lossless data compression using single clock cycle parallel connected compression circuits $310_1$, $310_2$, to $310_n$ (collectively compression circuit 310) for each DG distributed across the raster data width that provide a minimum compression ratio for each row of original input binary sensor data shown received shown as input data 305. The compression circuits $310_1$, $310_2$, to $310_n$ each comprises two components described below in FIG. 3B as a precedent selection circuit 310a for providing the precedent selection signals shown in FIG. 3A and a sample processing by differencing implemented by sample processing circuit 310b that uses the respective precedent values received from precedent selection circuit 310a to generate compressed data.

The compressed data output from the compression circuits $310_1$, $310_2$, to $310_n$ is shown coupled to a voting circuit 320 then to a DDR memory 330. There can be additional compression circuits which can be utilized to compress a row with different configuration values of DG size and drift. This can be followed by the voting circuit 320 shown, which compares the compression ratio achieved from all these computations and forwards the compressed data that corresponds to the best compression ratio to the DDR 330.

Figure 3B:
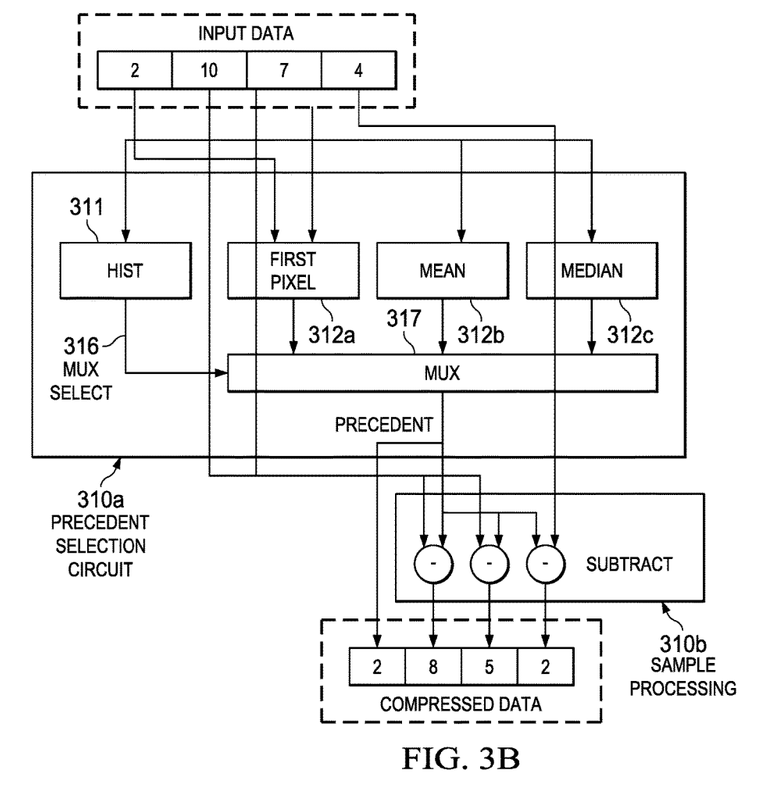
FIG. 3B shows example components for the precedent selection circuit and for the sample processing circuit.

FIG. 3B shows example components for the precedent selection circuit 310a and for the sample processing circuit 310b. The precedent selection circuit 310a shown in FIG. 3B can select from a plurality of different precedent selection options shown by example as first pixel 312a, average shown as mean 312b and median 312c depending upon the statistical distribution of input data calculated by the HIST block 311. HIST block 311 outputs a MUX select signal 316 to a MUX 317 which in response outputs a precedent value.

These compression circuits $310_1$, $310_2$, to $310n$ being electrically in parallel perform single clock cycle lossless compression over the input data 305 with a variety of configurations for DG size and dynamic range of drift and a data precedent selected based on the real-time calculations rendered. Output from these compression circuits $310_1$, $310_2$, to $310n$ is compressed output data generated for the different configurations as well as the compression ratio achieved by each. The output of the compression circuits $310_1$, $310_2$, to $310n$ is coupled to an input of a voting circuit 320 which implements voting for selecting precedents, DG size and drift that realized the best case compression and forwards the compressed data and CIP corresponding to that option to DDR memory 330 or another internal memory for storage.

Figure 4:
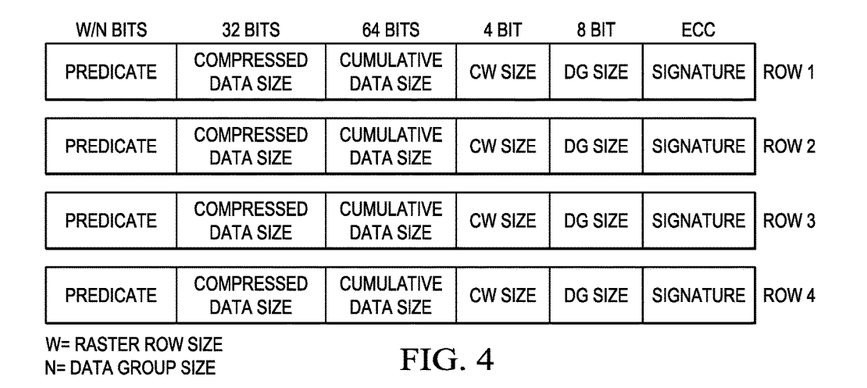
FIG. 4 shows example formation of a CIP that is with the compressed data for each row.

FIG. 4 shows example formation of a CIP for each of 4 rows shown as Row 1 to Row 4. CIPs are stored in memory along with the compressed data (see FIGS. 6A and 6B described below). As described above, a CIP is a packet of data created and stored together with each row. The CIP is generally not considered when calculating the compression ratio because the size of the CIP is generally significantly less than that of a typical row size. For example, in a 2 Mpixel camera, the uncompressed row size is 6 kbytes, while the size of CIP will be <100 bytes. The CIP information is created by the compression circuits while compressing data and used by the decompressor circuits for extracting (decompressing) the original data packet. The fields in the example CIP shown in FIG. 4 include the compressed predicate being 1 bit (shown as W/N bits, but a circuit can make the compressed predicate a fixed bit field (e.g., 512 bits) thereby putting a limit on the maximum number of DGs) for every DG to indicate compression or not, where W is the raster row size and N the data group size.

A compressed data size is shown as 32 bits, where the total compressed data size is for one row of raster data being 157 bits for the example in FIG. 2, and a cumulative data size shown as 64 bits that is the total compressed data size of the frame till that row. The CIP also includes a compressed word (CW) size this is a 4 bit value that stores the dynamic range of compression scheme for the row signature, a DG size that is an 8 bit value that stores the flexible DG size used to compress one particular row, and an ECC and/or CRC signature calculated for every CIP which in turn corresponds to a row of data to ensure functional safety and correctness of compression. The signature also ensures that even if a CIP is corrupted such as because of a cosmic alpha particle, electromagnetic interference (EMI), clock or power failure, it can be corrected on-the-fly and therefore the decompression process for the full frame happens correctly.

Figure 5A:
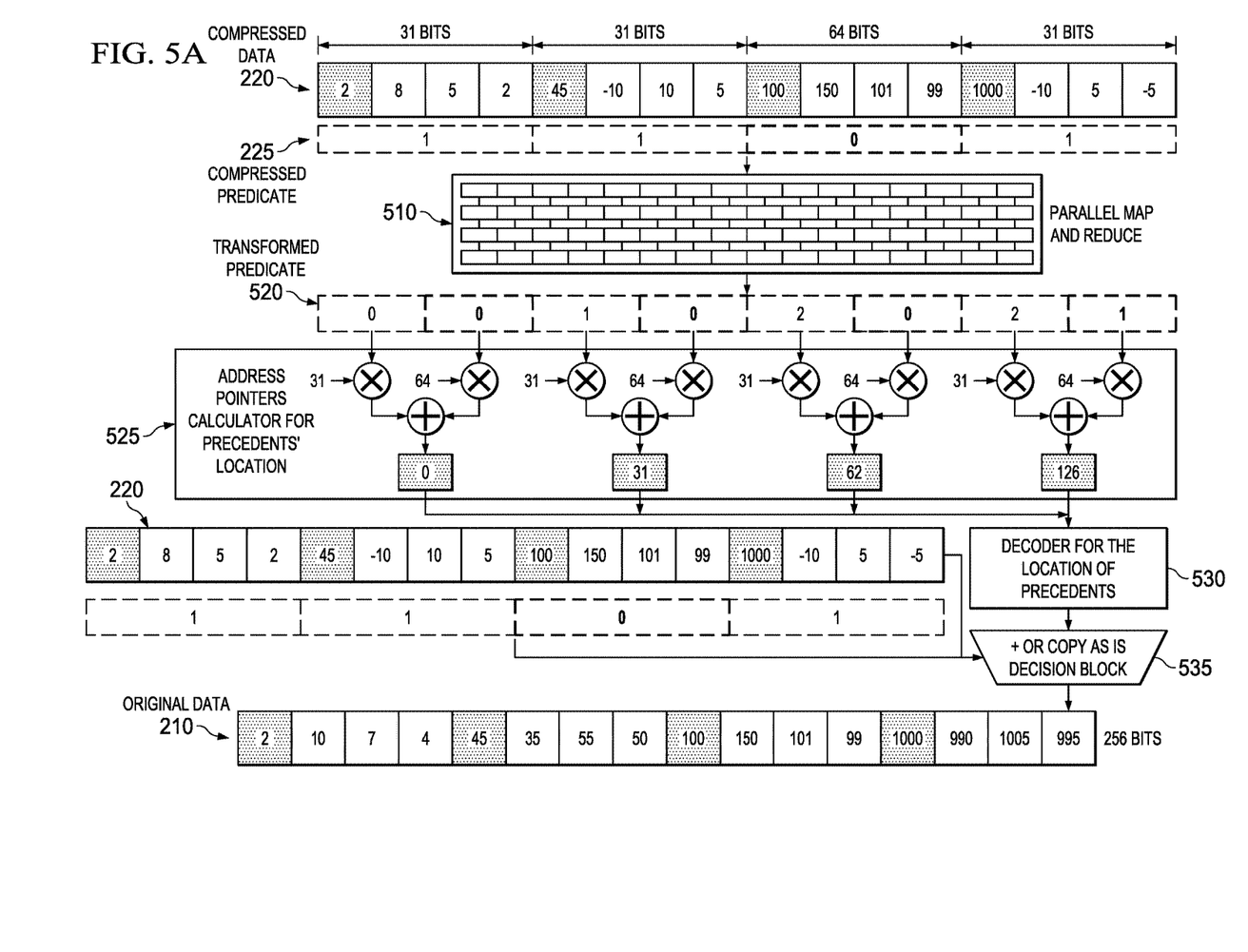
FIG. 5A shows an example decompression scheme using a 2/2 address calculation transform engine μ-architecture for decompression by converting disclosed compressed data into an uncompressed original data output.

FIG. 5A shows an example decompression scheme that uses an address calculation transform engine μ-architecture for converting compressed data into an uncompressed data output (the original data 210). The compressed data shown is this example is the compressed data 220 in FIG. 2 along with the compressed predicate of the respective DGs is processed by a parallel map and reduce block 510 that generates the transformed predicate 520 shown from the compressed predicates 225 received.

There is generally one transformed predicate computed for every DG. The usage of a parallel map and reduce block 510 circuit architecture based on systolic adders ensures that the transformed predicate values represent a dual data structure. The first part of the data structure has information about the number of DGs that were successfully compressed and this can be calculated from the compressed predicate 225 input with $\log_2$ n complexity to ensure fast computation. The second part of the transformed predicate 520 can contain cumulative information of how many DGs were stored uncompressed till that point in a row. This transformed predicate 520 is then followed by an address pointers calculator 525. This address pointers calculator 525 multiplies the first part of the transformed predicate 520 for a DG by the compressed word size (31 in this example) and the second part of the transformed predicate 520 with the compressed word size (64 in this example). These two values are then added to calculate the compressed precedents' location pointers in retrieved compressed data.

The output of the address pointers calculator 525 is coupled to a decoder 530 for decoding the location of the precedents as well as to compute the correct uncompressed data values. The decoder 530 fetches the precedent values from the compressed row data for each data group based on the address pointers calculator 525. It also receives the compressed predicate for the row being uncompressed as another input. The output of the decoder 530 is coupled to an add or copy as is decision block 535. If a DG was stored with compression as indicated by the compressed predicate, then the precedent value for that DG is added with the other values received in compressed data to calculate uncompressed data values. Otherwise the values in the compressed data are copied as is (no changes) by the add or copy as is decision block 535 as original data to a memory without adding these with precedents. This processing by add or copy as is decision block 535 results in return of the 256 bits of the row of original data 210 shown in FIG. 2.

Figure 5B:
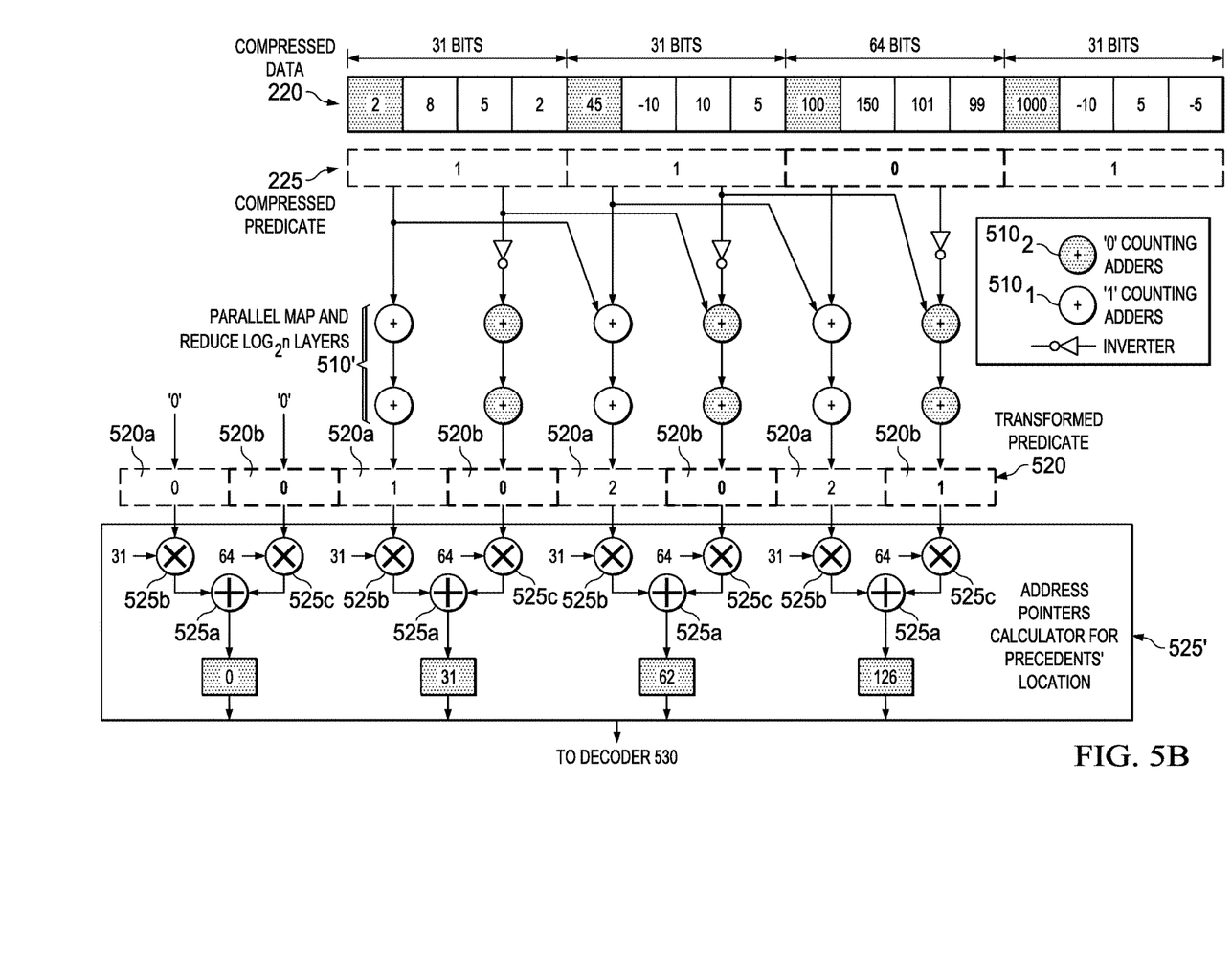
FIG. 5B shows an example circuit implementation for the address pointers calculator shown in FIG. 5A.

FIG. 5B shows an example circuit implementation for the address pointers calculator shown in FIG. 5A now shown as 525' along with the parallel map and reduce circuit 510 now shown as parallel map and reduce $\log_2$ n layers 510'. Address pointers calculator 525' includes an adder 525a that adds the outputs of its' preceding two multipliers 525b and 525c. 525b multiplies the first half 520a of the transformed predicate 520 for the corresponding DG with a fixed value that is equal to the size of compressed DG. 525c multiplies the second half 520b of the corresponding DG with a fixed value that is equal to the size of uncompressed DG.

The output of address pointers calculator 525' is coupled to decoder 530. The data structure for the transformed predicate 520 is calculated by a combination of map-reduce circuits $510_1$ and $510_2$. The input to both these circuits is the compressed predicate 225 for the data row being uncompressed. $510_1$ counts the number of data groups that were stored after successful compression preceding to the DG for the data row being uncompressed. $510_2$ counts the number of DGs that could not be compressed preceding to the DG for the data row being uncompressed.

Figure 5C:
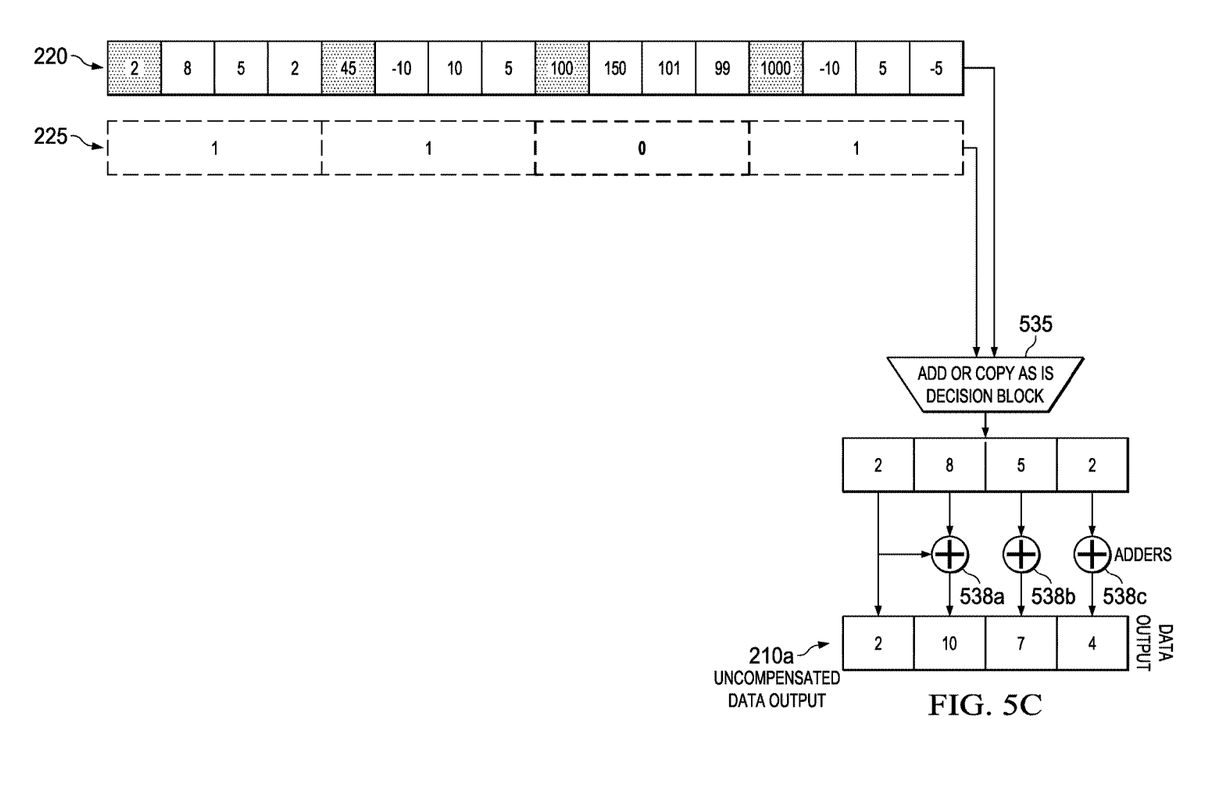
FIG. 5C shows an example of add or copy as is circuit operation.

FIG. 5C shows an example of the operation of an example add or copy as is block 535. The input to this circuit is compressed predicate 225, compressed data and the precedents that are fetched from the address locations decoded by decoder 530. If the compressed predicate indicates that the DG was stored after compression then the values received are added to the precedent by adders 538a, b and c, otherwise these values are copied as is (no change) shown as uncompensated data output 210a.

Figure 6A:
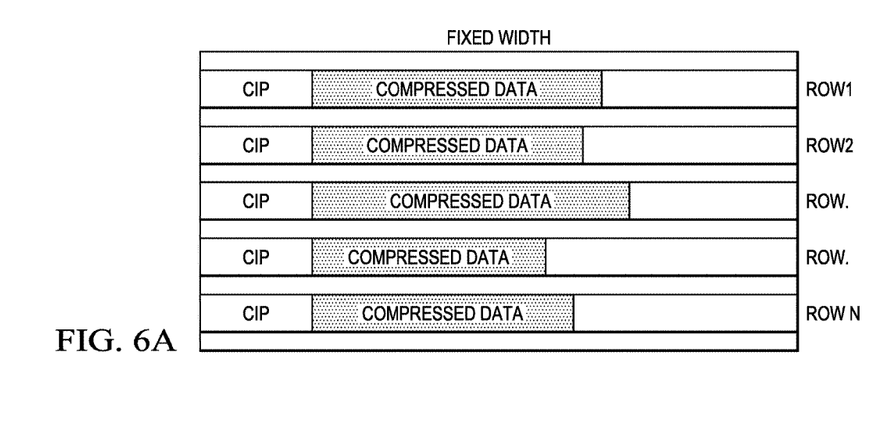
FIG. 6A shows a first example option for data storage in a DDR memory that comprises an inline option.

FIG. 6A shows a first example option for data storage of compressed data in a DDR memory. This is a simple inline option that generally does not optimize the DDR memory density. This method improves the DDR bandwidth for writing compressed data into memory. The CIP is prepended (attached as a header) to the actual compressed data packet. The compressed data is stored in memory such that the first byte of CIP of every rasterized row is at a location where the actual data would have been if it was uncompressed. This data storage format makes it easier to configure a DMA engine that can issue series of commands to access the data from every row in the frame. The DMA/streaming engine can pull in the CIP, process the packet, and then forward the packet to parallel map and reduce block 510, transformed predicate 520 and address pointers calculation block 525.

Figure 6B:
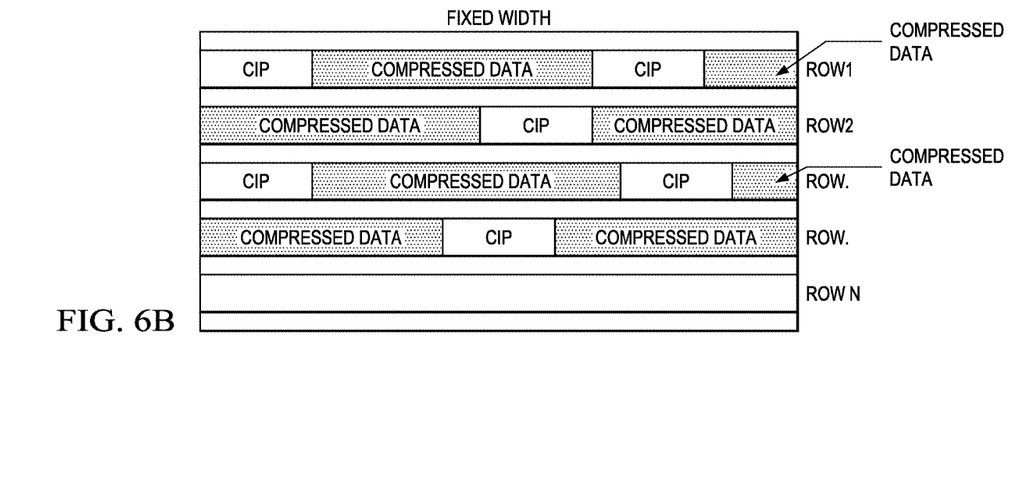
FIG. 6B shows a second example option for data storage in a DDR memory which comprises a dense storage option.

FIG. 6B shows a second example option for data storage in a DDR memory. This is a dense storage option that improves the DDR memory storage density, i.e. more data can be stored in the same DDR memory size compared to the first example option shown in FIG. 6A. In this case the CIP structure includes the address of the next CIP as well. Alternatively, the cumulative data size field of the CIP structure can be used to determine the start address of the next row of data. A DMA engine tasked with accessing compressed data frame reads the first CIP in the data frame, follows it up with fetching the exact bytes as indicated by the CIP to store the compressed row data and the CIP for the next row before forwarding the data it to the decompression circuit. Through this process the memory accessing logic of a DMA engine keeps calculating the addresses of the next access.

The address calculation thus performed is done through two unique processes, first with an optional CIP field that stores the address of the next CIP and the second by using the compressed data size field and adding it to the current address. This process ensures a functionally safe and reliable data access and guards against circuit failures caused by cosmic alpha particles, EMI, clock or random voltage noise.

Disclosed embodiments also include adaptive and scalable compression scheme algorithms. It is recognized that each dataset behaves differently and there is no ideal set of compression parameters to ensure the best compression results. One can define a constrained range of "valid parameters" for a range of DG sizes and compressed word sizes so that they are both flexible parameters. For example, the valid values of DG size can be 4, 8, 12 and 16. Similarly, valid values for the compressed word size can be between 6 and 12. For every row of data the following steps can be performed:

i) in parallel, run compression for the full row using the N parameter sets (N=all combinations of the DG size values and compressed word size values). Generate N CIPs;

ii) compare the size of the compressed data (compressed data size) from each of the runs in i) by comparing the relevant CIP fields (total compressed size), and iii) picking the best compressed word size and DG choice on the basis of the voting circuit 320 comparison of the compression ratios achieved for all performed configuration options.

This adaptive and scalable compression algorithm and logic is fully scalable and ensures that an optimal compressed dataset is created for each row of data. A 4× semiconductor (e.g., silicon) area of the compression scheme ensures a 4× improvement in performance. One can constrain the semiconductor area by using the same circuitry in a time-multiplexed fashion, at the cost of some latency.

Figure 7A:
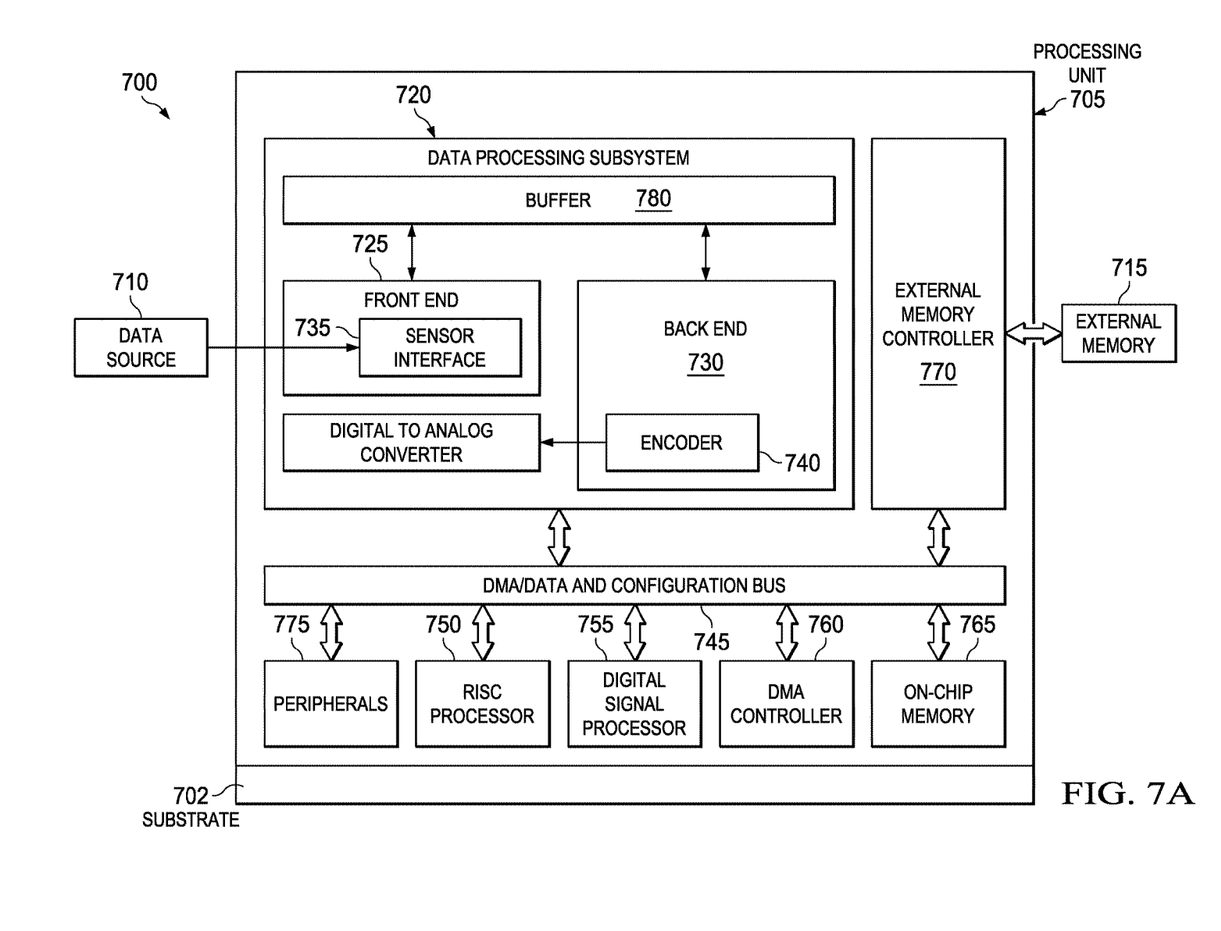
FIG. 7A is a block diagram of an example system for lossless data compression of sensed data streams (radar data or image data), according to an example embodiment.

Referring to FIG. 7A now, a system 700 for compressing data signals is shown including a processing unit 705. The processing unit 705 is shown formed on a substrate 702 having a semiconductor surface (e.g., silicon substrate) which can be implemented as a system-on-a-chip (SOC) architecture with distributed instantiation of the compression and decompression circuits. The processing unit 705 can comprise a microprocessor, digital signal processor (DSP), or a microcontroller unit (MCU). The processing unit 705 is in electronic communication with a sensed data source 710. Examples of the data source can include, but are not limited to, a digital camera, a camcorder, a mobile device or device that captures and provides a video signal indicative of a physical scene, or an antenna together with an analog front end in the case of radar. The processing unit 705 is in electronic communication with an external memory 715. An example of the external memory 715 is a DDR memory.

The processing unit 705 includes a processing subsystem 720 for processing the sensed date signal. The data processing subsystem 720 includes a front end 725 and a back end 730 that is coupled together by a buffer 780. The front end 725 includes a sensor interface 735 that receives the sensed data signal from the data source 710. The back end 730 includes an encoder 740 for generating a compressed version of the frames in the data signal according a disclosed compression scheme. In some embodiments, the encoder 740 can include a separate unit for generating a compressed version of the frames of the data signal. The processing unit 705 includes a direct memory access (DMA) data and configuration bus 745. The DMA data and configuration bus 745 transfer data and control signals between components in the processing unit 705.

The processing unit 705 includes a reduced instruction set computing (RISC) processor 750 that functions as a central processing unit. The RISC processor 750 is operable to perform input or output functions, and system control functions. The processing unit 705 includes a digital signal processor (DSP) 755. The DSP 755 is operable to process real-time signal processing software algorithms. In one embodiment, the DSP 755 is operable to process codecs. A codec can be defined as a coding or decoding software.

The processing unit 705 includes a DMA controller 760 for direct memory accessing. The processing unit 705 includes an on-chip memory 765 that stores frames of the data signal. An example of the on-chip memory 765 is a static random access memory (SRAM). The processing unit 705 can include other memories for storing the codecs. The processing unit 705 also includes an external memory controller 770 for controlling the external memory 715. The processing unit 705 includes one or more peripherals 775, for example a communication peripheral to transmit one or more frames of the data signal. Examples of the communication peripheral include ports and sockets. The peripherals 775 can also include a system peripheral such as a timer and temporary storage such as a RAM.

Figure 7B:
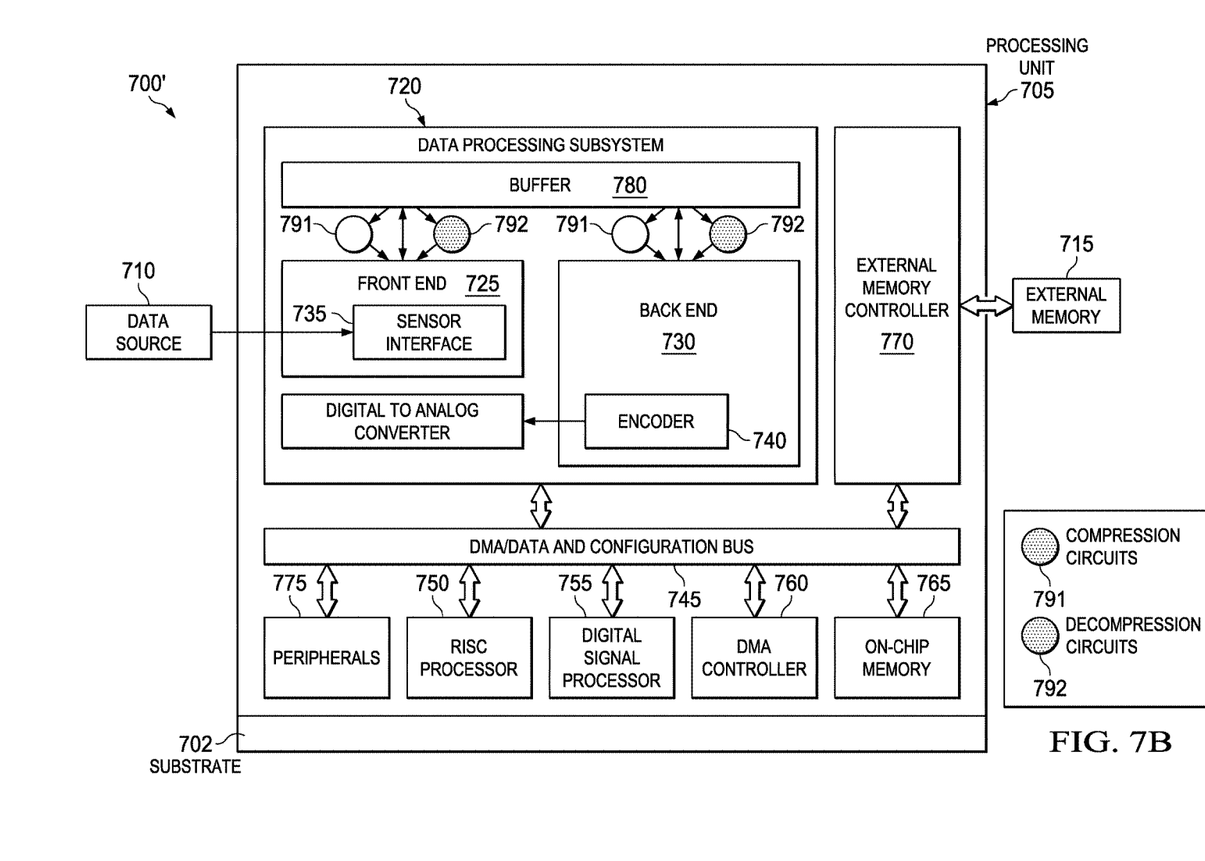
FIG. 7B is a block diagram of an example system for lossless data compression and decompressing of data signals.

FIG. 7B shows an example system 700' for compressing and decompressing data signals. System 700' includes disclosed compression circuits 791 and decompression circuits 792 between the buffer 780 and the front end including the sensor interface 735 and between the buffer 780 and the back end 730. The example architecture of system 700' ensures distributed compression and decompression blocks needed and instantiated at the inputs and outputs of various data processing and data input blocks of the system.

Figure 7C:
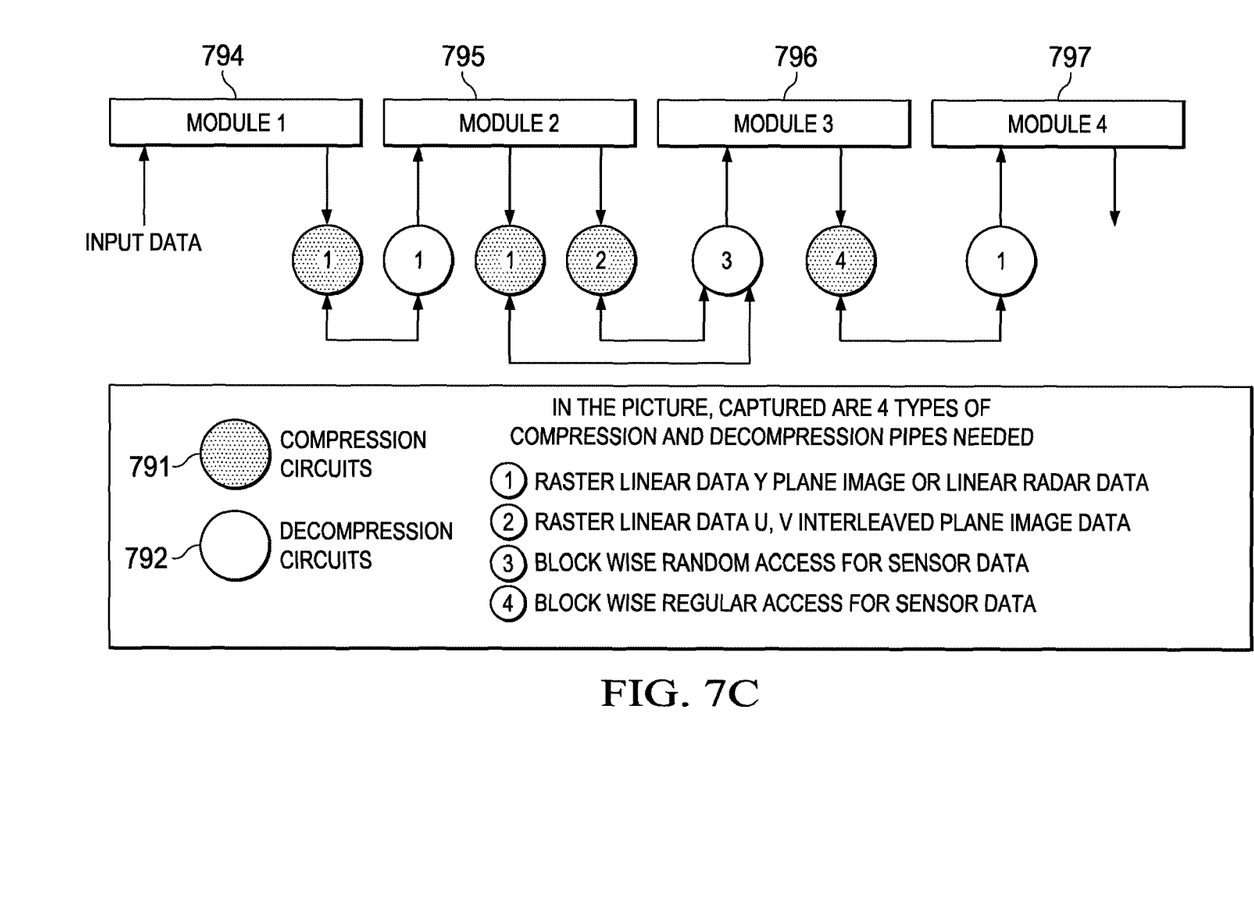
FIG. 7C depicts 4 types of compression and decompression blocks that can be used for implementing disclosed compression and decompression in an example system.

FIG. 7C depicts an example 4 types of compression and decompression blocks that can be used for implementing disclosed compression and decompression. The modules shown include modules 1-4 shown as modules 794, 795, 796 and 797. Each encircled number shown corresponds to a type of compression and decompression. Encircled 1 which can be processed by module 794 shown corresponds to raster linear (1D) data Y plane image or linear radar data, encircled 2 which can be processed by module 795 is shown corresponding to raster linear data U, V interleaved plane image data, encircled 3 which can be processed by module 796 is shown corresponding to block wise (2D) random access for sensor data, and encircled 4 which can be processed by module 797 is shown corresponding to block wise (2D) regular access for sensor data. This example shown can also instantiate compression and decompression blocks for handling linear radar data. The mechanisms, circuits and methods for compression and decompression allow the data handling for different data topologies (1D, 2D) and access patterns (regular or random) in fixed and deterministic time.

Advantages of disclosed embodiments include a simple lossless and dynamic adaptive data compression scheme. Disclosed compression enables random data access. Disclosed embodiments are particularly well suited for safety critical applications, with the disclosed CIP structure. There are potential Bill Of Materials (BOM) cost reductions for functional safety. Disclosed embodiments allow a variety of external memory storage schemes, both linear and block-wise. Disclosed embodiments also allow fixed density, decoupled control and data packets, and parallel processing of DGs which minimizes latency.

Examples

Disclosed embodiments are further illustrated by the following specific Examples, which should not be construed as limiting the scope or content of this Disclosure in any way.

Figure 8A:
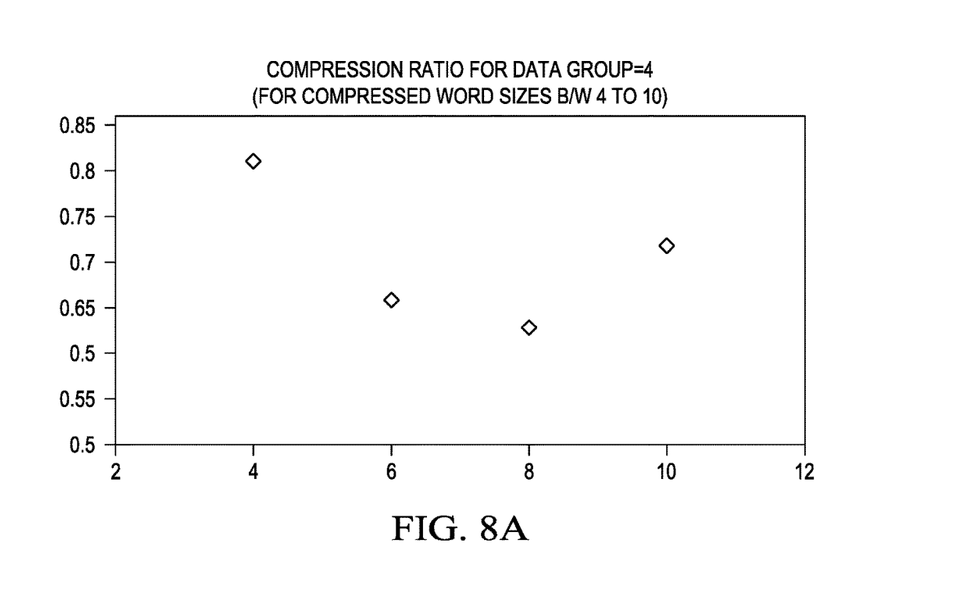
FIGS. 8A and 8B show experimentally determined compression ratio vs compression word size data for a DG size of 4 and 6, respectively for an example imaging application.
Figure 8B:
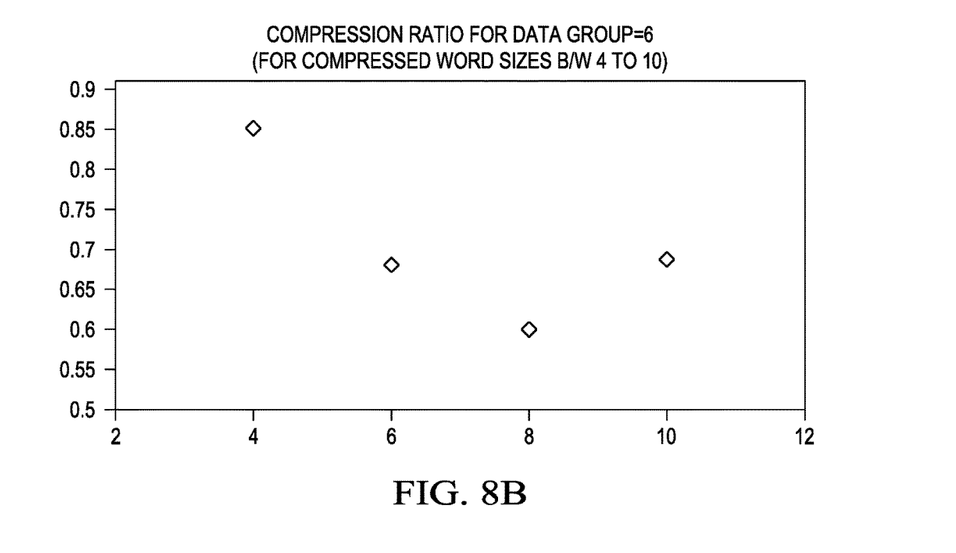

FIGS. 8A and 8B show compression ratio vs compression word size data for a DG size of 4 and 6, respectively, for an example imaging application using disclosed compression and decompression. For this example, data was generated by varying the DG size 4 in FIG. 8A and DG size 6 in FIG. 8B. The X-axis in FIGS. 8A and 8B records the CW size used for compression. In this particular example, the best compression ratio is achieved for a CW size of 8 and DG size of 6 that is roughly equal to 0.6. The original data samples were 16 bit image data (pixels). Each frame included about 300,000 pixels. The post compression bandwidth is seen to have been reduced to 60% of the uncompressed data. For 12 bit image data (not shown), the achievable compression ratio was found to be about 70%.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of lossless data compression, comprising:
obtaining binary sensor data comprising a plurality of rows with each said row including a plurality of multi-bit data samples;
dividing each said row into a plurality of data groups each including two or more of said multi-bit data samples;
selecting a precedent value for each said row or respective ones of said precedent values for each of said plurality of data groups;
generating a compressed row of compressed sensor data from each said row by calculating differences between each said data sample and said precedent value for its associated one of said data groups;
generating a Compression Information Packet (CIP) for each said row having information for losslessly returning said binary sensor data including a compressed predicate comprising a data structure which indicates whether each of said data groups is stored compressed, a data group size being a multi-bit value that stores a group size used for row compression, and a compressed word size being a multi-bit value that stores a dynamic range of said row compression, and
storing said compressed rows as stored compressed data along with said CIPs.

2. The method of claim 1, wherein said method comprises parallel single clock cycle processing of all of said plurality of data groups.

3. The method of claim 1, further comprising using a voting circuit that dynamically selects said compressed word size.

4. The method of claim 1, further comprising dynamically selecting compression parameters controlled by configuration, the compression parameters including a drift being a difference between a current data value and said precedent value within said data group, said compressed word size, said precedent values, and said data group size.

5. The method of claim 1, further comprising decompressing said stored compressed data to recover said binary sensor data including accessing a random location in a fixed time.

6. The method of claim 5, wherein said decompressing comprises a single cycle for said recovery of said binary sensor data.

7. The method of claim 1, further comprising using parallel map-reduce functions and a single cycle address pointer calculation for said decompressing.

8. The method of claim 1, wherein said CIP includes at least one error correction code (ECC) or a cyclic redundancy check (CRC) field.

9. A system for providing lossless data compression, comprising:
a sensor interface for receiving binary sensor data comprising a plurality of rows with each said row including a plurality of multi-bit data samples;
a data processing subsystem including an encoder having an input coupled to an output of said sensor interface, said data processing subsystem including hardware and software for:
dividing each said row into a plurality of data groups each including two or more of said multi-bit data samples;
selecting a precedent value for each said row or respective ones of said precedent values for each of said plurality of data groups;
generating a compressed row of compressed sensor data from each said row by calculating differences between each said data sample and said precedent value for its associated said data groups, and
generating a Compression Information Packet (CIP) for each said row having information for losslessly returning said binary sensor data including a compressed predicate comprising a data structure which indicates whether each of said data groups is stored compressed, a data group size being a multi-bit value that stores a group size used for row compression, and a compressed word size being a multi-bit value that stores a dynamic range of said row compression.

10. The system of claim 9, wherein said data processing subsystem further provides storing said compressed rows as stored compressed data along with said CIPs.

11. The system of claim 9, wherein said data processing subsystem includes circuitry for parallel processing of said plurality of data groups.

12. The system of claim 9, wherein said encoder comprises a substrate having a semiconductor surface.

13. The system of claim 9, further comprising a single clock cycle compression circuit for implementing said lossless data compression.

14. The system of claim 10, further comprising a voting circuit for dynamical selecting said compressed word size.

15. The system of claim 10, further comprising a dynamic selecting compression parameter block for dynamically selection compression parameters including a drift being a value of a difference between a current data value and said precedent value within said data group, said compressed word size, said precedent values, and said data group size.

16. The system of claim 10, further comprising a decoder for decompressing said stored compressed data to recover said binary sensor data.

17. The system of claim 16, wherein said decoder comprises a decompression circuit which operates in a single cycle for said recovery of said binary sensor data.

18. The system of claim 16, further comprising using parallel map-reduce functions and a single cycle address pointers calculator for identifying a location of said precedent values for said decompressing.

19. The system of claim 10, wherein said CIP includes at least one error correction code (ECC) or a cyclic redundancy check (CRC) field.

* * * * *